(12) United States Patent
Matsuura et al.

(10) Patent No.: US 6,551,921 B2
(45) Date of Patent: Apr. 22, 2003

(54) METHOD OF POLISHING A STACK OF DIELECTRIC LAYERS INCLUDING A FLUORINE CONTAINING SILICON OXIDE LAYER

(75) Inventors: Masazumi Matsuura, Tokyo (JP); Kinya Goto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/785,248

(22) Filed: Feb. 20, 2001

(65) Prior Publication Data

US 2001/0021557 A1 Sep. 13, 2001

Related U.S. Application Data

(62) Division of application No. 09/359,654, filed on Jul. 26, 1999, now Pat. No. 6,222,256.

(30) Foreign Application Priority Data

Mar. 30, 1999 (JP) .............................. 11-87521

(51) Int. Cl.$^7$ .................. H01L 21/4763; H01L 21/302; H01L 21/31
(52) U.S. Cl. ................... 438/633; 438/622; 438/623; 438/624; 438/692; 438/783
(58) Field of Search .............................. 438/622–624, 438/692, 695, 703, 633, 759, 778, 783, 784, 786, 787

(56) References Cited

U.S. PATENT DOCUMENTS

| 5,661,093 | A | * | 8/1997 | Ravi et al. ................... 438/763 |
| 6,028,013 | A | * | 2/2000 | Annapragada et al. ....... 438/783 |
| 6,057,242 | A | * | 5/2000 | Kishimoto |
| 6,103,601 | A | * | 8/2000 | Lee et al. ..................... 438/513 |
| 6,222,256 | B1 | | 4/2001 | Matsuura et al. ........... 257/640 |

* cited by examiner

*Primary Examiner*—Ha Tran Nguyen
(74) *Attorney, Agent, or Firm*—Oblon, Spivak, McClelland, Maier & Neustadt, P.C.

(57) ABSTRACT

A first layer metal wire, an SiOF film and an F diffusion prevention film are formed on a surface of a base layer including a substrate, elements formed on the substrate and an insulator layer formed to cover the substrate and the elements. The F diffusion prevention film may be prepared from a silicon oxynitride film or a silicon oxide film containing Si—H bonds. A spacer film is formed on a surface of the F diffusion prevention film and its surface is flattened. A second layer metal wire is formed on a surface of the spacer film. Thus implemented is a semiconductor device comprising an F diffusion prevention film preventing F atoms contained in an SiOF film from diffusing into an upper metal wire with the F diffusion prevention film not etched in formation of the upper metal wire and a method of manufacturing a semiconductor device not directly polishing an SiOF film by CMP.

11 Claims, 16 Drawing Sheets

F I G. 11
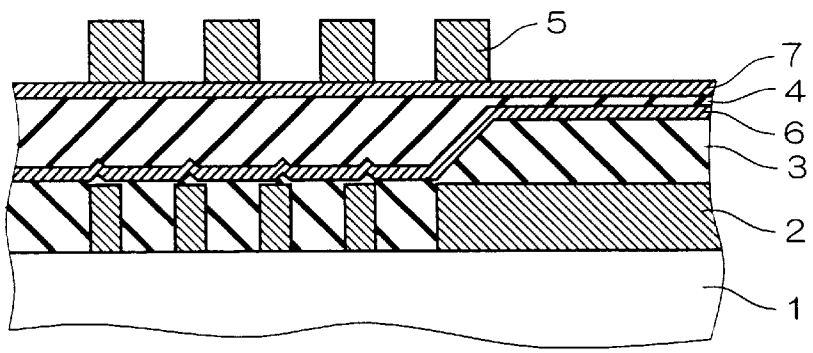
F I G. 12
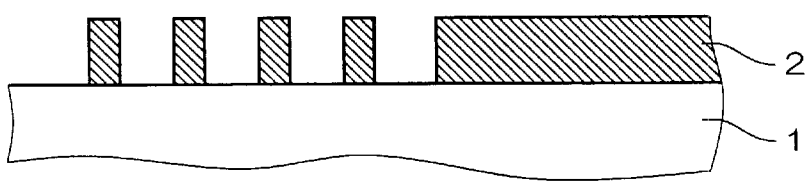
F I G. 13
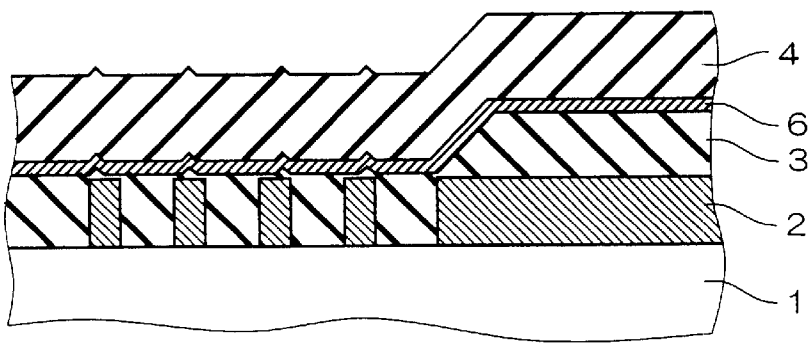

METHOD OF POLISHING A STACK OF DIELECTRIC LAYERS INCLUDING A FLUORINE CONTAINING SILICON OXIDE LAYER

This application is a divisional of prior application Ser. No. 09/359,654 filed Jul. 26, 1999, now U.S. Pat. No. 6,222,256.

BACKGROUND OF THE INVENTION

1. Field of the Invention

The present invention relates to a semiconductor device comprising an interlayer isolation film isolating an upper layer wire and a lower layer wire interconnected through a contact hole and a method of manufacturing the same.

2. Description of the Background Art

In order to implement speed increase of a logic device following the subquarter micron generation, it is important to reduce signal delay of the device. While the signal delay of the device is expressed in the sum of delays in transistors and those in wires, influence by the signal delay in the wire increasingly exceeds that in the transistor following reduction of the wiring pitch. In order to reduce the signal delay in the wire, which is proportionate to the product of the resistance of the wire and the capacitance of an interlayer isolation film, either the wiring resistance or the capacitance of the interlayer isolation film must be reduced. As one of attempts for attaining this object, an interlayer isolation film having a low dielectric constant is actively studied.

In particular, a silicon oxide film containing fluorine (hereinafter referred to as F) is watched with interest. The relative dielectric constant of the silicon oxide film is reduced when bonds (hereinafter referred to as Si—F bonds) of silicon atoms and F atoms are introduced into the same. For example, the relative dielectric constant of 4.4 with no presence of Si—F bonds is reduced to 3.5 when F is introduced to be about 10% in atomic percentage concentration (a silicon oxide film containing F is hereinafter referred to as an SiOF film).

FIG. 16 typically illustrates the structure of a conventional semiconductor device D3 employing an SiOF film as an interlayer isolation film. The semiconductor device D3 comprises a base layer 101 including a substrate, elements formed on the substrate and an insulator layer formed to cover the substrate and the elements, and first layer metal wires 102 are selectively formed on a surface of the base layer 101 (in order to avoid complicated illustration, FIG. 16 shows neither the substrate, the elements and the insulator layer of the base layer 101 nor some of the first layer metal wires 102 connected with the elements of the base layer 102). The semiconductor device D3 further comprises an SiOF film 103 sufficiently covering the first layer metal wires 102 on the surfaces of the first layer metal wires 102, and a spacer film 104 consisting of a silicon oxide film, for example, having a flat surface is formed on a surface of the SiOF film 103. Second metal wires 105 of an Al alloy, for example, are selectively formed on the surface of the spacer film 104 (although not illustrated, the first and second layer metal wires 102 and 105 are generally in a multilayer structure of a barrier metal prepared by stacking TiN and Ti and a wiring metal such as an Al alloy).

In this semiconductor device D3, the SiOF film 103 and the spacer film 104 combinedly serve as an interlayer isolation film between the first layer metal wires 102 and the second layer metal wires 105. Due to the presence of the SiOF film 103, the electrostatic capacitance between the first layer metal wires 102 and the second layer metal wires 105 is at a smaller value than that through an interlayer isolation film consisting of only a silicon oxide film containing no F, for example.

FIGS. 17 to 20 successively show steps in a method of manufacturing the semiconductor device D3. First, the elements are formed on the substrate and then the insulator layer is formed to cover the substrate and the elements, thereby preparing the base layer 101. Then, a metal film for the barrier metal and a metal film for the wires are formed on the surface of the base layer 101 and worked into a prescribed pattern by photolithography, for forming the first layer metal wires 102 (FIG. 17). Then, the SiOF film 103 is formed to cover the first layer metal wires 102. At this time, the SiOF film 103 is formed by high density plasma CVD (hereinafter referred to as HDPCVD) to sufficiently fill up clearances between the adjacent first layer metal wires 102.

Then, a silicon oxide film is formed as the spacer film 104 on the surface of the SiOF film 103 by plasma CVD, for example (FIG. 18). Then, an irregular surface of the spacer film 104 is polished by chemical mechanical polishing (hereinafter referred to as CMP), thereby forming a flat surface 104A (FIG. 19). Then, a metal film is formed on the flat surface 104A similarly to that for the first layer metal wires 102, for forming the second layer metal wires 105 by photolithography (FIG. 19).

The reason for preparing the interlayer isolation film not only from the SiOF film 103 but also from the spacer film 104 is now described. When its surface is exposed to an atmosphere containing moisture, an SiOF film having low density readily absorbs the moisture contained in the atmosphere. Molecules of water, which are slightly polarized even in an ordinary state, disadvantageously raise the relative dielectric constant of the SiOF film when taken into the film. If no spacer film 104 is formed on the SiOF film 103 of the semiconductor device D3, the SiOF film 103 must be flattened by CMP. This is because formation of upper wires or the interlayer isolation film may be hindered if the interlayer isolation film is irregular. In CMP, however, water is splashed on the surface of the semiconductor device D3 in the stage of polishing or posttreatment, and hence the SiOF film 103 remarkably absorbs water. Then, it follows that the relative dielectric constant of the SiOF film 103, which must have a low dielectric constant, increases. In order to avoid such a situation, therefore, the spacer film 104 must be formed on the surface of the SiOF film 103 as a spacer for CMP.

In order to reduce the relative dielectric constant of the SiOF film, the concentration of F contained therein may be increased. If the concentration of F is excessively increased, however, instable F insufficiently bonded with Si comes to exist in the film. In this case, the instable F desorbs from the Si—F bonds in the stage of heat treatment after film formation and diffuses in the interlayer isolation film, to reach the metal wires formed on the interlayer isolation film. While the metal wires are generally formed by stacking an Al alloy or the like on a barrier metal prepared by stacking TiN and Ti as described above, F reaching the metal wires react with Ti contained in the barrier metal to form a titanium fluoride. This titanium fluoride has extremely inferior adhesion to the interlayer isolation film, and hence the barrier metal readily peels off on the interface between the same and the interlayer isolation film due to influence by stress occurring in the later step of CMP or the like.

FIGS. 21A to 21C illustrate this problem with reference to a region RG in FIG. 16. FIG. 21A shows the second layer metal wire 105 as a multilayer structure of a wiring metal 105*a* and a barrier metal 105*b*. When instable F atoms 108 contained in the SiOF film 103 move toward the outermost surface side of the spacer film 104 through the heat treatment in the later step as shown in FIG. 21B, a layer 105*c* of a titanium fluoride is formed in the barrier metal 105*b* as shown in FIG. 21C.

FIG. 22 shows distribution of the respective components forming the region RG along the film thickness direction through SIMS (secondary ion mass spectroscopy). Referring to FIG. 22, the F distribution has its maximum P in the Ti layer, to prove that F diffuses from the SiOF film 103 and reacts with the Ti layer in the barrier metal 105*b* to form the titanium fluoride.

Thus, a countermeasure is necessary for preventing F contained in the SiOF film from diffusing into the metal wires while increasing the F concentration in the film. A technique of forming a film (hereinafter referred to as an F diffusion prevention film) preventing diffusion of F on the surface of the SiOF film has been devised as such a countermeasure. For example, Japanese Patent Laying-Open Gazette No. 10-270554 (1998) or 8-148562 (1996) discloses such a technique.

FIG. 23 illustrates the technique described in Japanese Patent Laying-Open Gazette No. 10-270554 with reference to a semiconductor device D4. The semiconductor device D4 comprises a base layer 101 and first layer metal wires 102, similarly to the semiconductor device D3. Further, the semiconductor device D4 comprises an SiOF film 103 sufficiently covering the first layer metal layers 102 on surfaces of the base layer 101 and the first layer metal wires 102. Dissimilarly to the semiconductor device D3, however, the semiconductor device D4 comprises no spacer film 104 but the SiOF film 103 has a flat surface. Further, the semiconductor device D4 comprises an F diffusion prevention film 106 prepared from a silicon nitride film, for example, on the surface of the SiOF film 103. Second layer metal wires 105 are formed on a surface of the F diffusion prevention film 106.

FIGS. 24 to 28 successively illustrate steps in a method of manufacturing the semiconductor device D4. Similarly to the method of manufacturing the semiconductor device D3, the base layer 101 is prepared and the first layer metal wires 102 are formed on the surface of the base layer 101 (FIG. 24). Then, the SiOF film 103 is formed to cover the first layer metal wires 102 (FIG. 25). Then, the surface of the SiOF film 103 is polished by CMP for forming a flat surface 103A (FIG. 26). The F diffusion prevention film 106 is formed on the flat surface 103A (FIG. 27), and the second layer metal wires 105 are formed on the surface of the F diffusion prevention film 106 through heat treatment for discharging absorbed moisture (FIG. 28).

In this semiconductor device D4, the F diffusion prevention film 106 is provided on the surface of the SiOF film 103 so that F atoms hardly diffuse from the SiOF film 103. Therefore, a Ti layer of a barrier metal forming the second layer metal wires 105 hardly changes to a titanium fluoride and the possibility of peeling of the second layer metal wires 105 reduces. Further, the F diffusion prevention film 106 has functions of not only suppressing diffusion of F atoms but also preventing the SiOF film 103 from absorbing external moisture.

In this technique, however, the surface of the SiOF film 103 is directly polished by CMP in the step shown in FIG. 26, to result in the aforementioned problem of moisture absorption of the SiOF film 103. While the absorbed moisture is discharged through the later heat treatment, the moisture cannot be completely discharged. Therefore, it is preferable to avoid direct polishing of the surface of the SiOF film 103 by CMP.

SUMMARY OF THE INVENTION

According to a first aspect of the present invention, a semiconductor device comprises a base layer having a surface, a first interlayer isolation film, formed on the surface of the base layer, having a surface and consisting of a silicon oxide film containing fluorine, a second interlayer isolation film, formed on the surface of the first interlayer isolation film, having a surface and containing bonds of silicon atoms and nitrogen atoms, bonds of silicon atoms and hydrogen atoms, or nitrogen atoms, and a third interlayer isolation film formed on the surface of the second interlayer isolation film.

When employing the semiconductor device according to the first aspect of the present invention, the first interlayer isolation film is so present that the value of the electrostatic capacitance of the interlayer isolation film can be reduced as compared with the case of forming such an interlayer isolation film only by a silicon oxide film containing no fluorine. Further, the second interlayer isolation film is so formed that fluorine hardly diffuses from the surface of the first interlayer isolation film. When forming a wire on a surface of the third interlayer isolation film, therefore, there is a small possibility that the wire peels off. The second interlayer isolation film has functions of not only suppressing diffusion of fluorine but also preventing the first interlayer isolation film from absorbing external moisture. In addition, no metal wire is directly formed on the surface of the second interlayer isolation film, whereby the second interlayer isolation film is not etched and reduced in thickness also when a metal wire is formed by photolithography.

According to a second aspect of the present invention, the second interlayer isolation film is a silicon oxynitride film.

According to a third aspect of the present invention, the second interlayer isolation film is a silicon oxide film containing bonds of silicon atoms and hydrogen atoms.

According to a fourth aspect of the present invention, the second interlayer isolation film is a silicon oxide film injected with nitrogen atoms.

According to a fifth aspect of the present invention, the third interlayer isolation film is a silicon oxide film.

According to a sixth aspect of the present invention, the semiconductor device further comprises a fourth interlayer isolation film, formed on the surface of the third interlayer isolation film, containing bonds of silicon atoms and nitrogen atoms, bonds of silicon atoms and hydrogen atoms, or nitrogen atoms.

When employing the semiconductor device according to the sixth aspect of the present invention, the effects of the semiconductor device according to the first aspect can be attained. Even if the fourth interlayer isolation film is etched, prevention of diffusion of fluorine atoms and prevention of moisture absorption of the first interlayer isolation film are implemented due to the formation of the second interlayer isolation film. If the fourth interlayer isolation film is not etched, on the other hand, the aforementioned effects can be rendered more reliable.

According to a seventh aspect of the present invention, the fourth interlayer isolation film is a silicon oxynitride film.

According to an eighth aspect of the present invention, the fourth interlayer isolation film is a silicon oxide film containing bonds of silicon atoms and hydrogen atoms.

According to a ninth aspect of the present invention, the fourth interlayer isolation film is a silicon oxide film injected with nitrogen atoms.

According to a tenth aspect of the present invention, a method of manufacturing a semiconductor device comprises first to fifth steps of preparing a base layer having a surface, forming a first interlayer isolation film having a surface and consisting of a silicon oxide film containing fluorine on the surface of the base layer, forming a second interlayer isolation film having a surface and containing bonds of silicon atoms and nitrogen atoms, bonds of silicon atoms and hydrogen atoms, or nitrogen atoms on the surface of the first interlayer isolation film, forming a third interlayer isolation film having a surface on the surface of the second interlayer isolation film, and polishing and flattening the surface of the third interlayer isolation film by chemical mechanical polishing.

When employing the method of manufacturing a semiconductor device according to the tenth aspect of the present invention, the semiconductor device according to the first aspect can be manufactured. Further, the surface of not the first interlayer isolation film but the third interlayer isolation film is polished and flattened by CMP, whereby the first interlayer isolation film will not remarkably absorb moisture during the steps but a semiconductor device having a flat surface can be obtained.

According to an eleventh aspect of the present invention, the second interlayer isolation film is a silicon oxynitride film.

According to a twelfth aspect of the present invention, the second interlayer isolation film is a silicon oxide film containing bonds of silicon atoms and hydrogen atoms.

According to a thirteenth aspect of the present invention, the third step is a step of forming the second interlayer isolation film by high density plasma CVD employing silane and oxygen as gases under a condition of a gas flow ratio of (oxygen gas flow rate/silane gas flow rate)$\leq 1.6$.

When employing the method of manufacturing a semiconductor device according to the thirteenth aspect of the present invention, a number of bonds of silicon atoms and hydrogen atoms can be introduced into the first interlayer isolation film.

According to a fourteenth aspect of the present invention, the second interlayer isolation film is a silicon oxide film injected with nitrogen atoms.

According to a fifteenth aspect of the present invention, the third interlayer isolation film is a silicon oxide film.

According to a sixteenth aspect of the present invention, the method of manufacturing a semiconductor device further comprises a sixth step of forming a fourth interlayer isolation film containing bonds of silicon atoms and nitrogen atoms, bonds of silicon atoms and hydrogen atoms, or nitrogen atoms on the surface of the third interlayer isolation film subsequently to the fifth step.

When employing the method of manufacturing a semiconductor device according to the sixteenth aspect of the present invention, the semiconductor device according to the sixth aspect can be manufactured. Further, the effects of the method of manufacturing a semiconductor device according to the tenth aspect can be attained.

According to a seventeenth aspect of the present invention, the fourth interlayer isolation film is a silicon oxynitride film.

According to an eighteenth aspect of the present invention, the fourth interlayer isolation film is a silicon oxide film containing bonds of silicon atoms and hydrogen atoms.

According to a nineteenth aspect of the present invention, the sixth step is a step of forming the second interlayer isolation film by high density plasma CVD employing silane and oxygen as gases under a condition of a gas flow ratio of (oxygen gas flow rate/silane gas flow rate)$\leq 1.6$.

According to a twentieth aspect of the present invention, the fourth interlayer isolation film is a silicon oxide film injected with nitrogen atoms.

An object of the present invention is to implement a semiconductor device comprising an SiOF film not to be polished by CMP and an F diffusion prevention film preventing F atoms contained in the SiOF film from diffusing into metal wires, and to implement a method of manufacturing a semiconductor device not directly polishing an SiOF film by CMP.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 illustrates a semiconductor device according to an embodiment 3 of the present invention;

FIGS. 12 to 15 illustrate steps in a method of manufacturing a semiconductor device according to an embodiment 4 of the present invention;

DESCRIPTION OF THE PREFERRED EMBODIMENTS

Before describing the preferred embodiments, we consider the background art.

Figure 29:
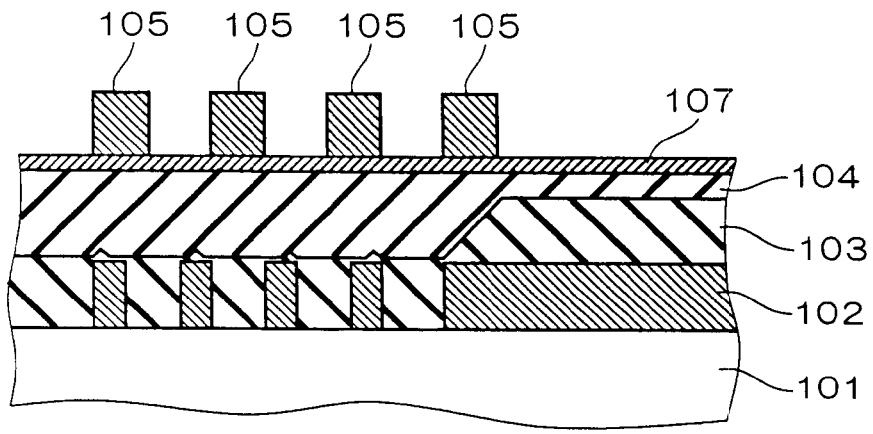
FIG. 29 illustrates a semiconductor device having a structure combining conventional techniques.

FIG. 29 shows a semiconductor device D5 having a structure combining the semiconductor devices D3 and D4 with each other. In the semiconductor device D5, an F diffusion prevention film 107 is further formed between a spacer film 104 and second layer metal wires 105, in addition to the structure of the semiconductor device D3.

Figure 30:
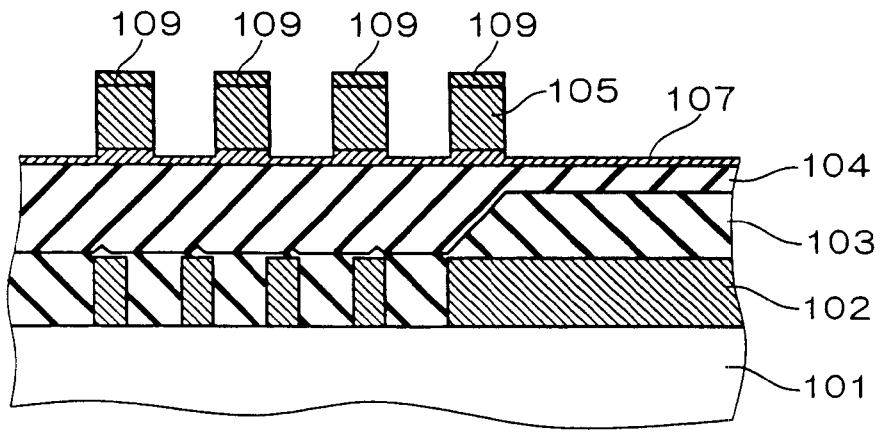
FIG. 30 illustrates a problem of the semiconductor device having the structure combining the conventional techniques.

In each of the semiconductor devices D4 and D5, however, the second layer metal wires 105 are directly formed on the surface of the F diffusion prevention film 106 or 107. As shown in FIG. 30, therefore, the F diffusion prevention film 107 may be etched together when etching the second layer metal wires 105 through resist films 109 serving as patterning masks. If the F diffusion prevention film 107 is etched and reduced in thickness, the effects of preventing diffusion of F atoms and preventing moisture absorption of the SiOF film 103 are undesirably reduced.

On the other hand, the technique disclosed in Japanese Patent Laying-Open Gazette No. 8-148562 takes into consideration neither flattening of the surface of the SiOF film nor formation of second layer metal wires on the SiOF film but has the aforementioned problems in the technique described in Japanese Patent Laying-Open Gazette No. 10-270554.

Embodiment 1.

Figure 1:
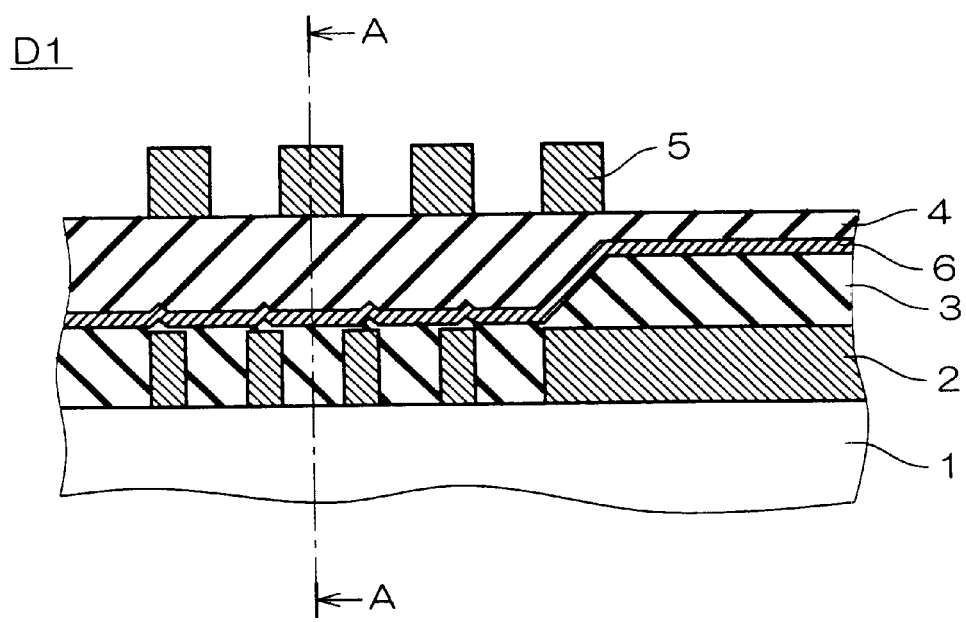
FIG. 1 illustrates a semiconductor device according to an embodiment 1 of the present invention.

FIG. 1 typically illustrates the structure of a semiconductor device D1 according to an embodiment 1 of the present invention. The semiconductor device D1 comprises a base layer 1 including a substrate, elements formed on the substrate and an insulator layer formed to cover the substrate and the elements, and selectively comprises first layer metal wires 2 on a surface of the base layer 1 (FIG. 1 shows neither the substrate, the elements and the insulator layer of the base layer 1 nor some of the first layer metal wires 2 connected with the elements of the base layer 1, similarly to the cases of the semiconductor devices D3, D4 and D5). The semiconductor device D1 further comprises an SiOF film 3 sufficiently covering the first layer metal wires 2 on surfaces of the base layer 1 and the first layer metal wires 2, and comprises an F diffusion prevention film 6 on a surface of the SiOF film 3. The F diffusion prevention film 6 may be prepared from a silicon oxynitride film containing bonds (hereinafter referred to as Si—N bonds) of silicon atoms and nitrogen atoms or a silicon oxide film containing bonds (hereinafter referred to as Si—H bonds) of silicon atoms and hydrogen atoms, for example. It is conceivable that the Si—N bonds contained in the former or the Si—H bonds contained in the latter are effective for preventing diffusion of F atoms. It is also conceivable that single nitrogen atoms are also effective for preventing diffusion of F atoms, and hence the F diffusion prevention film 6 may be prepared from a film containing nitrogen atoms bonded with no other atoms. Such a film can be prepared by forming a silicon oxide film and thereafter injecting the same with nitrogen atoms, for example. While a silicon nitride film also contains Si—N bonds, a silicon oxynitride film is preferable for the F diffusion prevention film 6 to the silicon nitride film. This is because the silicon oxynitride film containing bonds (hereinafter referred to as Si—O bonds) of silicon atoms and oxygen atoms has high adhesion to the SiOF film 3 similarly containing Si—O bonds.

The semiconductor device D1 further comprises a spacer film 4 having a flat surface on a surface of the F diffusion prevention film 6. A silicon oxide film, for example, may be employed for the spacer film 4. Second layer metal wires 5 are formed on the surface of the spacer film 4. The first and second layer metal wires 2 and 5 have a multilayer structure of a barrier metal (not shown) prepared by stacking TiN and Ti and a wiring metal such as an Al alloy, for example.

Figure 2:
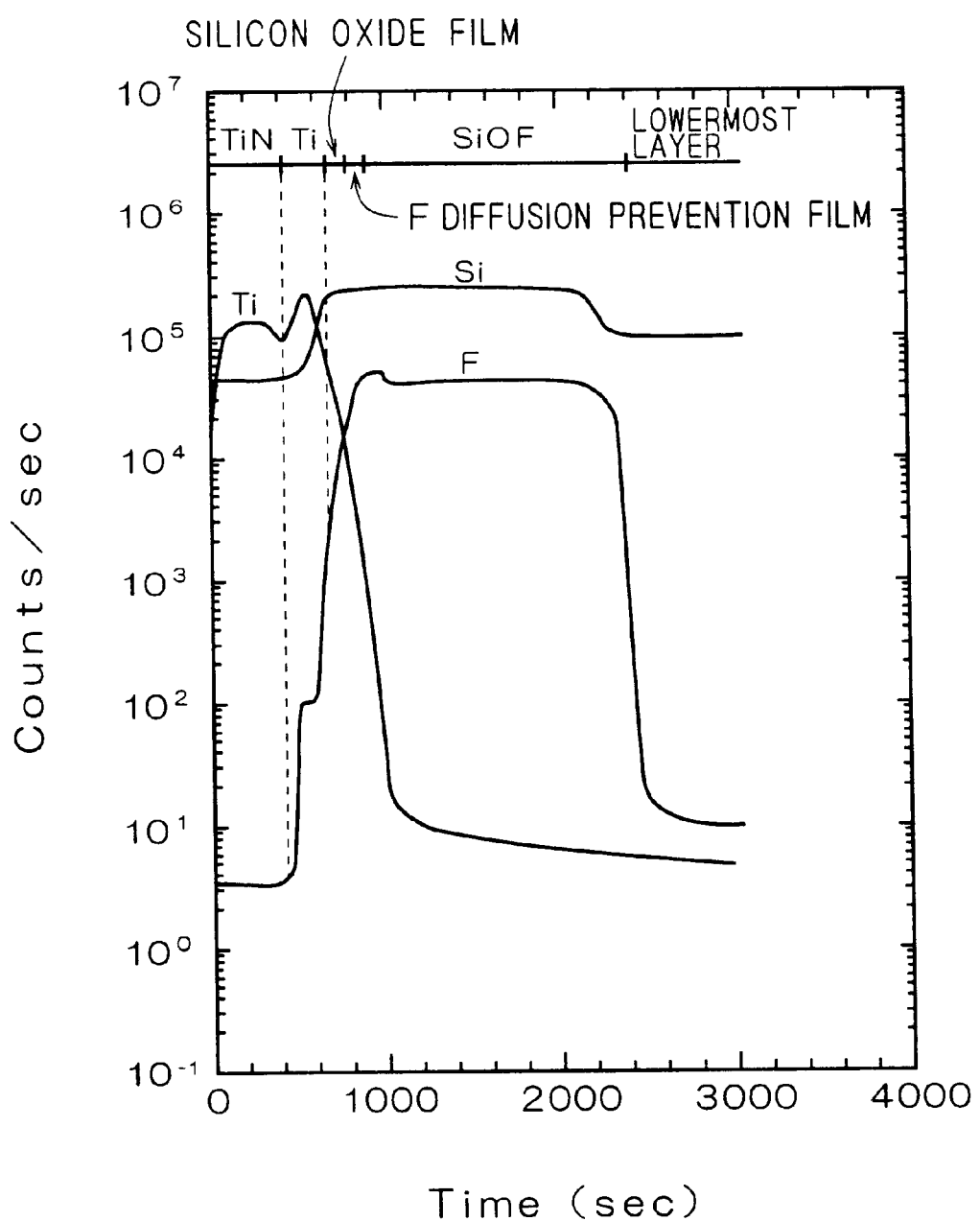
FIG. 2 illustrates measurement results in a thickness direction of the semiconductor device according to the embodiment 1 of the present invention through SIMS.

When employing the semiconductor device D1 according to this embodiment, the SiOF film 3, the F diffusion prevention film 6 and the spacer film 4 combinedly serve as an interlayer isolation film between the first layer metal wires 2 and the second layer metal wires 5, while the electrostatic capacitance between the first layer metal wires 2 and the second layer metal wires 5 is smaller than that in the case of forming an interlayer isolation film only by a silicon oxide film containing no F, due to the presence of the SiOF film 3. And F atoms hardly diffuse because the F diffusion prevention film 6 is formed. FIG. 2 illustrates measurement results of F distribution in a thickness direction of the semiconductor device D1 along a section A—A through SIMS. In this case, the F diffusion prevention film 6 is formed by a silicon oxynitride film. Referring to FIG. 2, a Ti layer has no maximum of F dissimilarly to FIG. 22. Thus, the Ti layer included in the barrier metal forming the second layer metal wires 5 hardly changes to a titanium fluoride and there is a small possibility that the second layer metal wires 5 peel off. Thus, the dielectric constant can be readily suppressed by forming the SiOF film 3 with a high F content.

The F diffusion prevention film 6 has functions of not only suppressing diffusion of F atoms but also preventing the SiOF film 3 from absorbing external moisture. Further, the second layer metal wires 5 are not directly formed on the surface of the F diffusion prevention film 6, whereby the F diffusion prevention film 6 is neither etched nor reduced in thickness also when the second layer metal wires 5 are formed by photolithography.

Embodiment 2.

Figure 3:
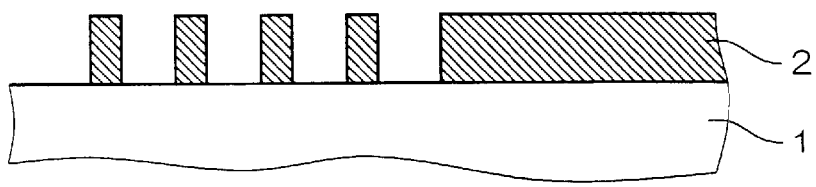
FIGS. 3 to 6 illustrate steps in a method of manufacturing a semiconductor device according to an embodiment 2 of the present invention.
Figure 4:
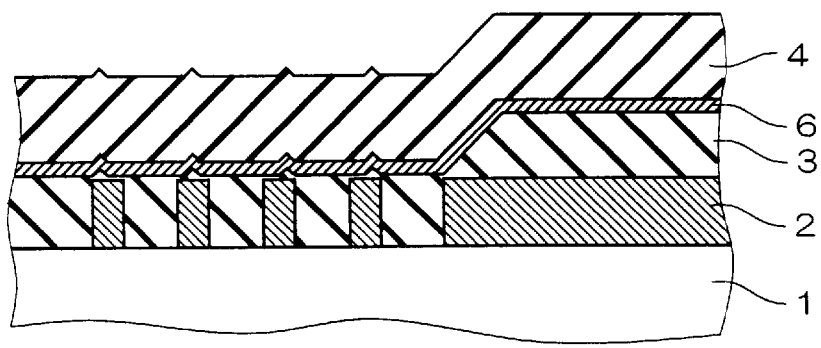

FIGS. 3 to 6 show steps in a method of manufacturing the semiconductor device D1. First, the elements are formed on the substrate and the insulator layer is formed to cover the substrate and the elements, thereby preparing the base layer 1. Then, a metal film for the barrier metal and that for the wires are formed on the surface of the base layer 1 and worked into a prescribed pattern by photolithography, for forming the first layer metal wires 2 (FIG. 3).

Figure 7:
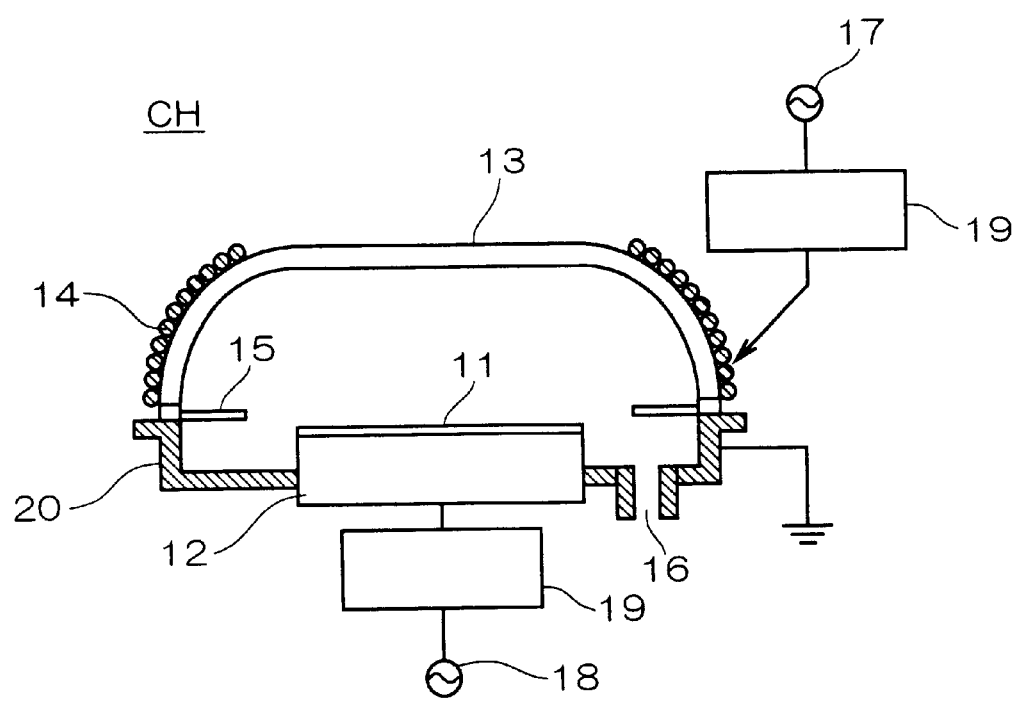
FIG. 7 illustrates the structure of a CVD chamber employed for HDPCVD.

Then, the SiOF film 3 is formed to cover the first layer metal wires 2. At this time, the SiOF film 3 is formed through HDPCVD to be capable of sufficiently filling up clearances between the adjacent first layer metal wires 2. A CVD chamber CH shown in FIG. 7, for example, is employed for HDPCVD. The CVD chamber CH is formed by a holder 12 holding a substrate 11, a grounded vacuum vessel 20 having a gas nozzle 15 and an exhaust port 16, a ceramic dome 13 having a coil electrode 14 on its outer wall, a source high-frequency power supply 17 for feeding a current to the coil electrode 14, a substrate bias high-frequency power supply 18 for supplying a bias to the holder 12 and a matcher 19 for matching signals from the power supplies 17 and 18. HDPCVD is performed under the following conditions (film forming conditions 1), for example:

(Film Forming Conditions 1)
Gas Flow Rate
Silane ($SiH_4$): 60 (sccm)
Tetrafluorosilane ($SiF_4$): 40 (sccm)
Oxygen ($O_2$): 200 (sccm)
Argon (Ar): 200 (sccm)
*sccm: standard cubic centimeter per minute Power of Source High-Frequency Power Supply: 3300 (W)

Power of Substrate Bias High-Frequency Power Supply: 3000 (W)

Film Forming Pressure: 6 (mTorr)

Film Forming Temperature: 400 (° C.)

Then, the F diffusion prevention film 6 is formed on the surface of the SiOF film 3. When employing a silicon oxynitride film as the F diffusion prevention film 6, for example, the film is formed by plasma CVD under the following conditions (film forming conditions 2), for example:

(Film Forming Conditions 2)

Gas Flow Rate

Silane ($SiH_4$): 200 (sccm)

Nitrous Oxide ($N_2O$): 1400 (sccm)

Nitrogen ($N_2$): 100 (sccm)

Power of High-Frequency Power Supply: 500 (W)

Film Forming Pressure: 5 (Torr)

Film Forming Temperature: 400 (° C.)

Alternatively, the silicon oxynitride film may be formed by HDPCVD under the following conditions (film forming conditions 3), for example:

(Film Forming Conditions 3)

Gas Flow Rate

Silane ($SiH_4$): 100 (sccm)

Oxygen ($O_2$): 200 (sccm)

Nitrogen ($N_2$): 20 (sccm)

Argon (Ar): 100 (sccm)

Power of Source High-Frequency Power Supply: 3300 (W)

Power of Substrate Bias High-Frequency Power Supply: 3000 (W) or 0 (W)

Film Forming Pressure: 6 (mTorr)

Film Forming Temperature: 400 (° C.)

When employing a silicon oxide film containing Si—H bonds as the F diffusion prevention film 6, for example, the film is formed by HDPCVD under the following conditions (film forming conditions 4), for example:

(Film Forming Conditions 4)

Gas Flow Rate

Silane ($SiH_4$): 100 (sccm)

Oxygen ($O_2$): 145 (sccm)

Argon (Ar): 100 (sccm)

Power of Source High-Frequency Power Supply: 3300 (W)

Power of Substrate Bias High-Frequency Power Supply: 3000 (W) or 0 (W)

Film Forming Pressure: 6 (mTorr)

Film Forming Temperature: 400 (° C.)

Figure 8:
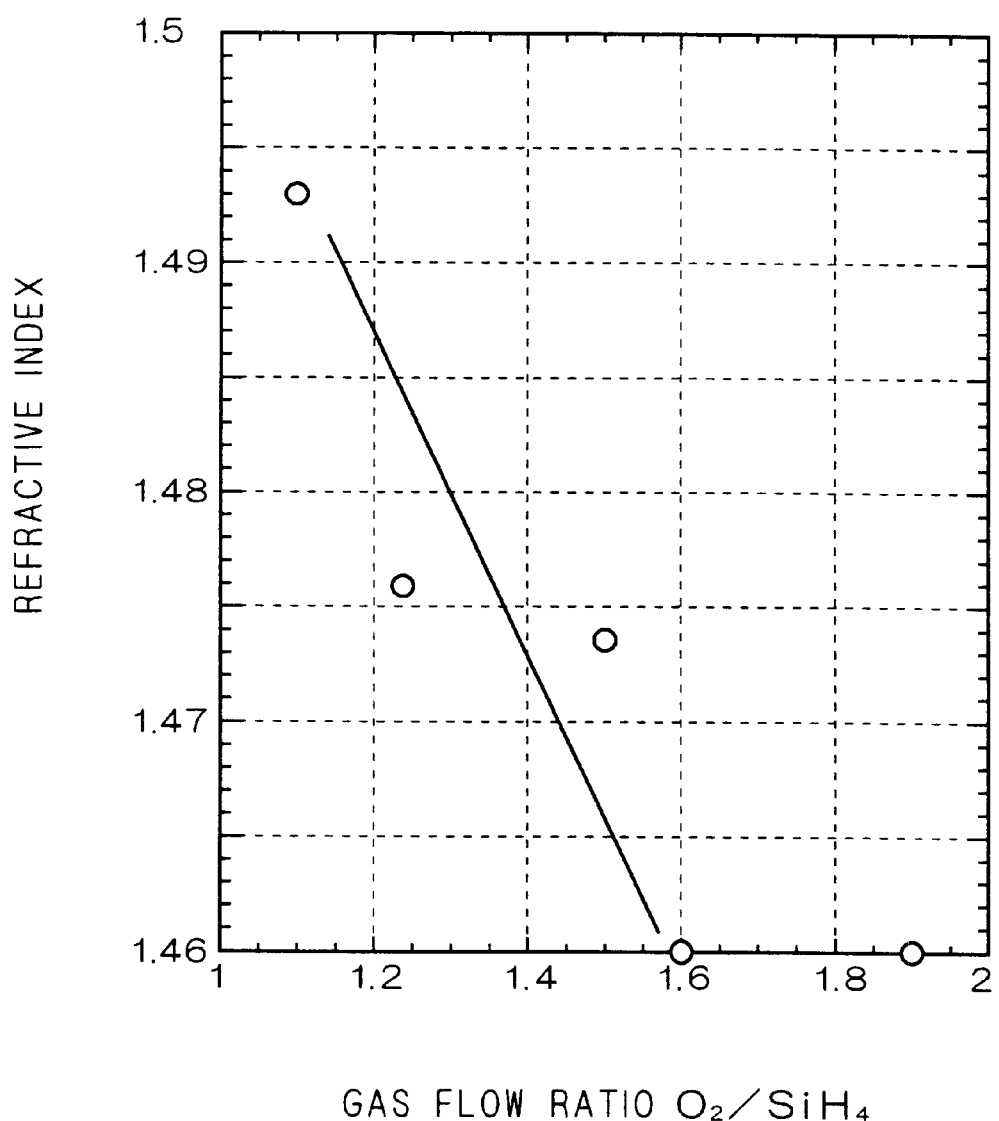
FIG. 8 is a graph showing investigation results of gas flow ratios of oxygen/silane and refractive indices of silicon oxide films in the method of manufacturing a semiconductor device according to the embodiment 2 of the present invention.

In this case, the numerical ratios of the gas flow rates for oxygen and silane are preferably so set that oxygen/silane$\leq 1.6$, as shown in (Film Forming Conditions 4). In this case, it is conceivable that silane is so insufficiently oxidized that Si—H bonds are readily mixed into the silicon oxide film in place of Si—O bonds. FIG. 8 shows investigation results of refractive indices of silicon oxide films formed at various ratios of gas flow rates of oxygen and silane. It is understood from this graph that the refractive index of the film abruptly increases when the gas flow ratio of oxygen/silane is not more than 1.6. The refractive index conceivably increases due to reduction of Si—O bonds, i.e., increase of Si—H bonds. This is because the refractive index of a silicon oxide film containing a large amount of Si—O bonds is 1.46 while silicon has a high refractive index of 3.45 and the refractive index has increased replacement of the Si—O components contained in the film with Si components.

Figure 9:
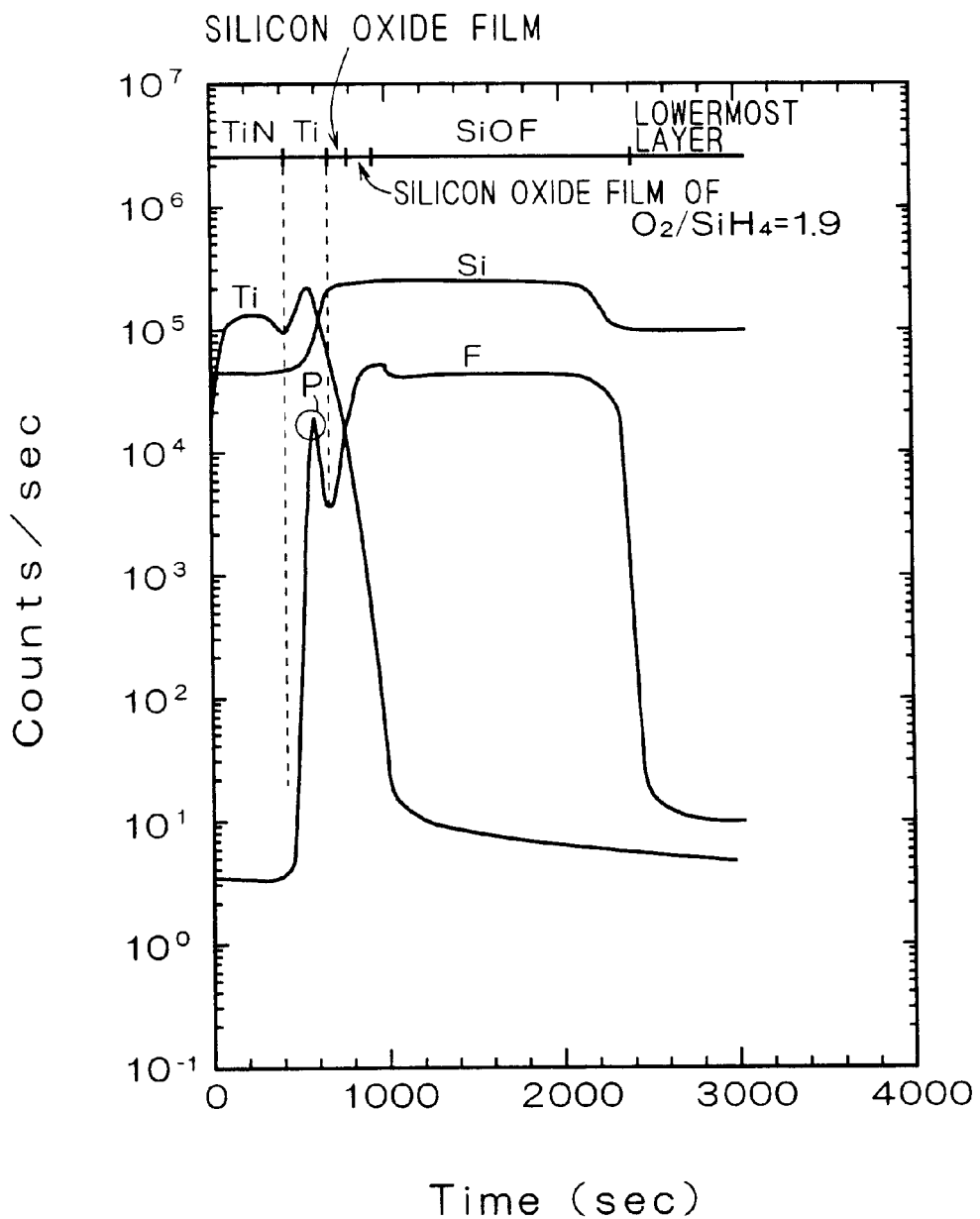
FIG. 9 illustrates measurement results by SIMS when setting the gas flow ratio of oxygen/silane at 1.9 in the method of manufacturing a semiconductor device according to the embodiment 2 of the present invention.
Figure 10:
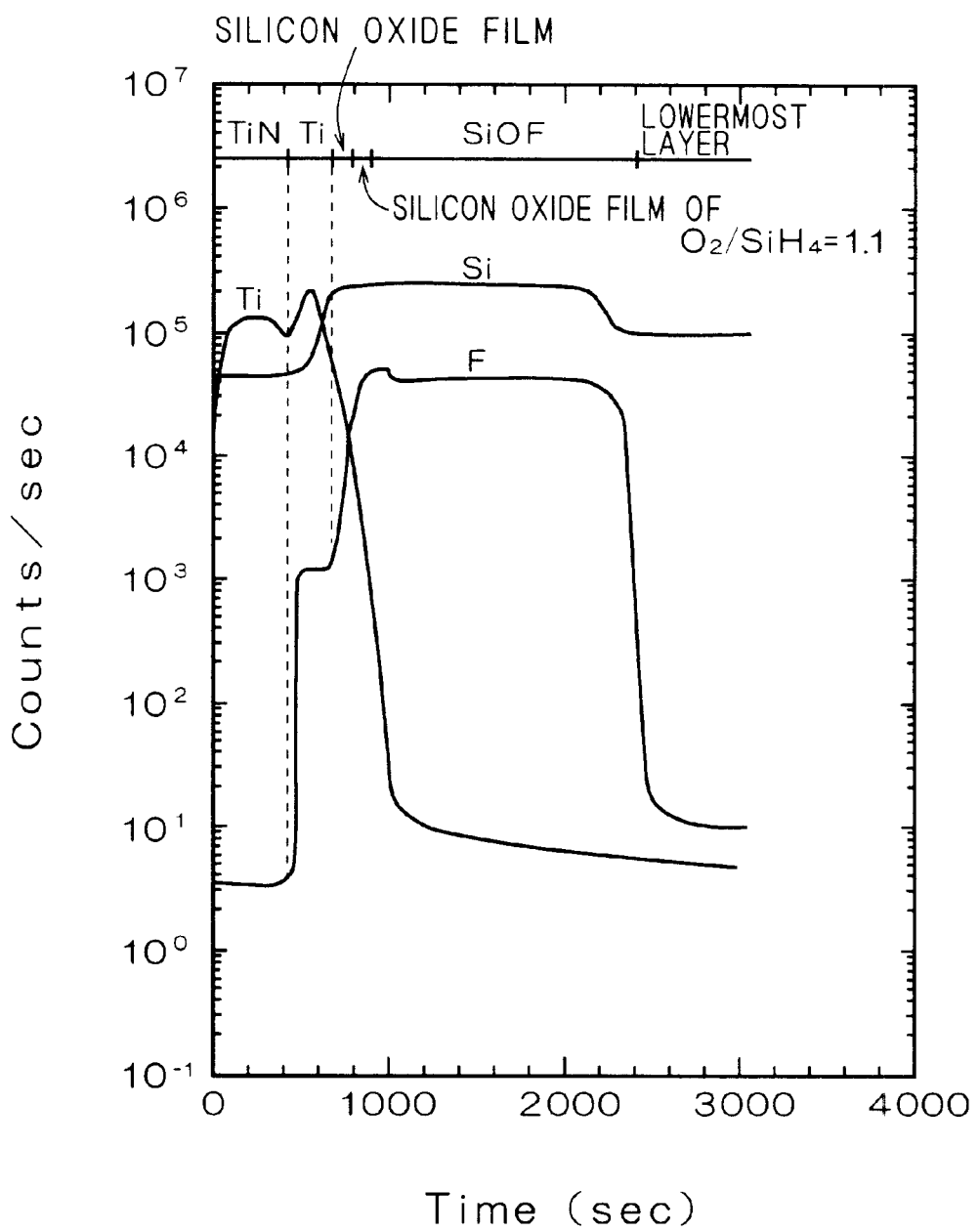
FIG. 10 illustrates measurement results by SIMS when setting the gas flow ratio of oxygen/silane at 1.1 in the method of manufacturing a semiconductor device according to the embodiment 2 of the present invention.
Figure 22:
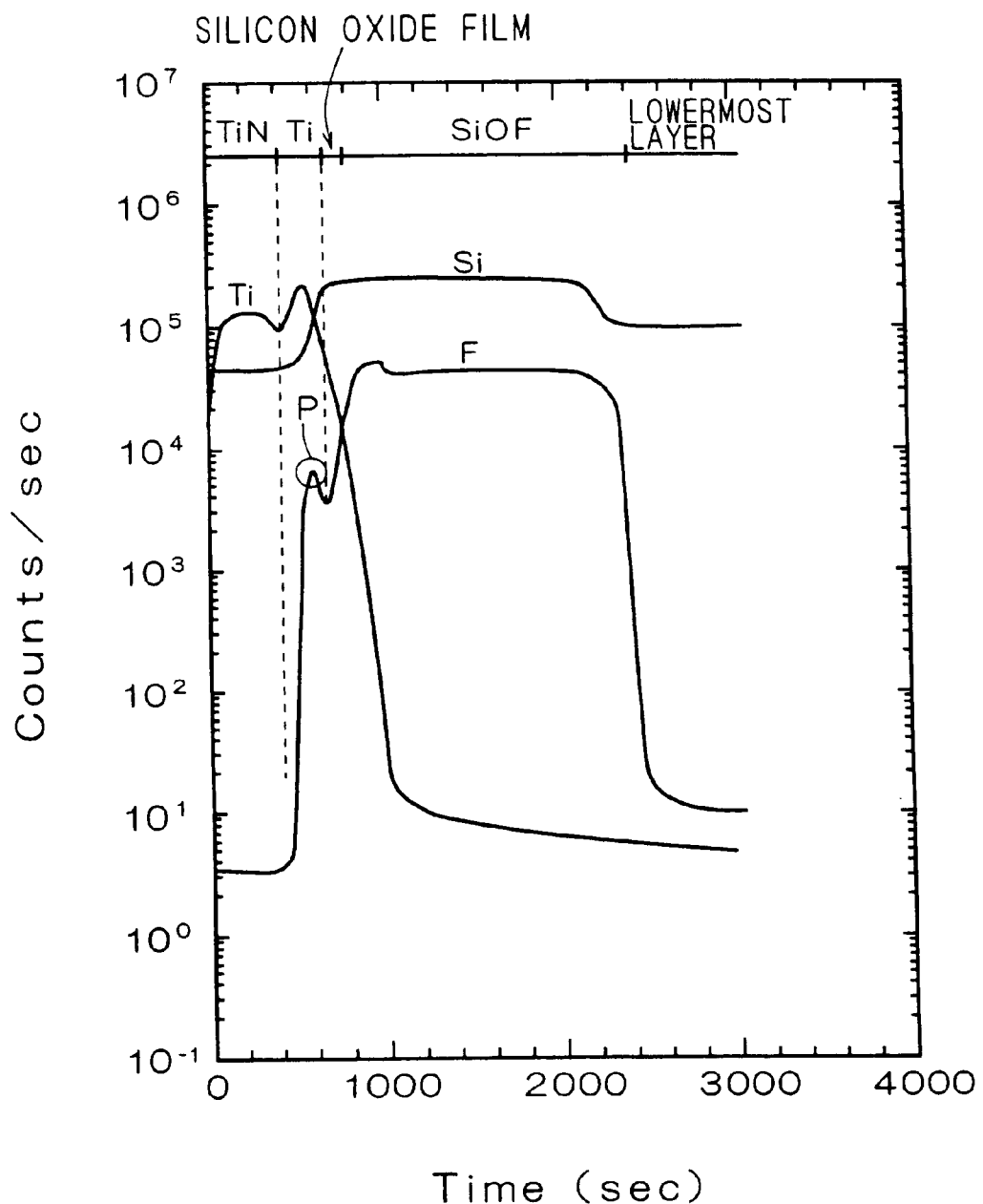
FIG. 22 illustrates measurement results in the film thickness direction of the conventional semiconductor device through SIMS.
Figure 23:
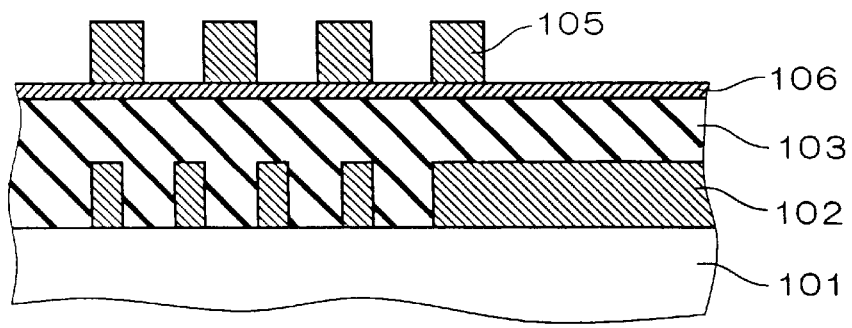
FIG. 23 illustrates another conventional semiconductor device.
Figure 24:
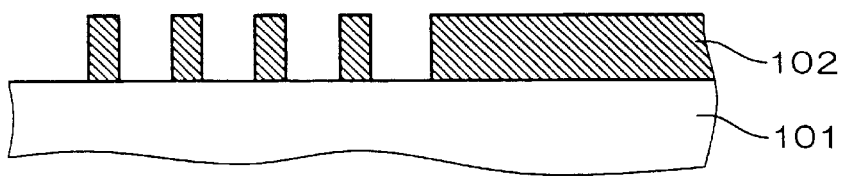
FIGS. 24 to 28 illustrate steps in a method of manufacturing the conventional semiconductor device.
Figure 25:
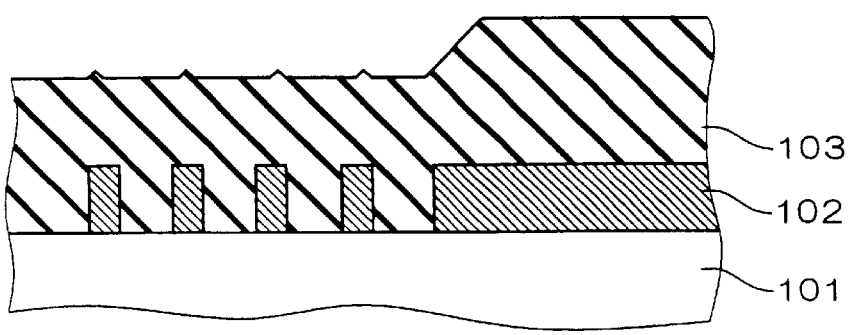
Figure 26:
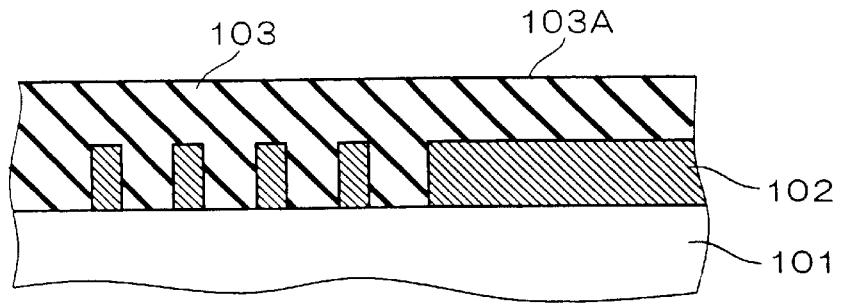
Figure 27:
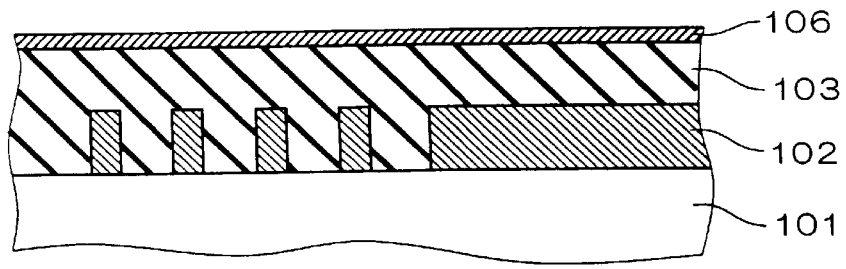
Figure 28:
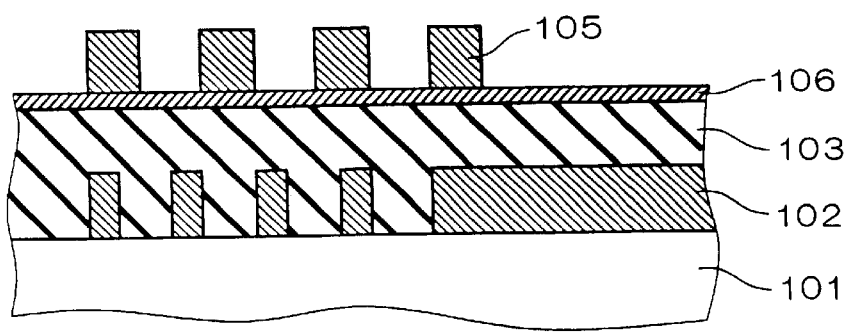

FIGS. 9 and 10 show measurement results by SIMS in relation to gas flow ratios oxygen/silane of 1.9 and 1.1 respectively. As understood from these figures, a maximum P of F distribution still exists in the Ti layer when the oxygen/silane gas flow ratio is 1.9, while F distribution does not increase in the Ti layer when the oxygen/silane gas flow ratio is 1.1. The maximum P of the F distribution in FIG. 9 is greater than that in FIG. 22 showing the SIMS result of the conventional semiconductor device D3. This is conceivably because the oxygen/silane gas flow ratio is generally set at about 1.7 when forming the silicon oxide film employed for the spacer film 4 or 104 and hence the content of the Si—H bonds is reduced due to insertion of the film having the oxygen/silane gas flow ratio of 1.9 to deteriorate fluorine diffusion preventing ability.

When preparing the F diffusion prevention film 6 by forming a silicon oxide film and thereafter injecting the same with nitrogen atoms, the silicon oxide film is formed by HDPCVD under the following conditions (film forming conditions 5), for example:

(Film Forming Conditions 5)

Gas Flow Rate

Silane ($SiH_4$): 100 (sccm)

Oxygen ($O_2$): 200 (sccm)

Argon (Ar): 200 (sccm)

Power of Source High-Frequency Power Supply: 3300 (W)

Power of Substrate Bias High-Frequency Power Supply: 3000 (W)

Film Forming Pressure: 6(mTorr)

Film Forming Temperature: 400 (° C.)

Then, the gas is replaced with nitrogen gas for injecting the silicon oxide film with nitrogen atoms by HDPCVD under the following conditions (film forming conditions 6), for example:

(Film Forming Conditions 6)

Gas Flow Rate

Nitrogen ($N_2$): 100 (sccm)

Power of Source High-Frequency Power Supply: 3300 (W)

Power of Substrate Bias High-Frequency Power Supply: 1000 (W)

Film Forming Pressure: 3 (mTorr)

Film Forming Temperature: 400 (° C.)

Then, the spacer film 4 is formed on the surface of the F diffusion prevention film 6. When employing a silicon oxide film as the spacer film 4, for example, the film is formed by plasma CVD under the following conditions (film forming conditions 7), for example (FIG. 4):

(Film Forming Conditions 7)

Gas Flow Rate

Tetraethoxysilane (TEOS): 900 (sccm)

Oxygen ($O_2$): 900 (sccm)

Power of High-Frequency Power Supply: 500 (W)

Film Forming Pressure: 5 (Torr)

Film Forming Temperature: 400 (° C.)

Alternatively, the silicon oxide film may be formed as the spacer film 4 by HDPCVD under the aforementioned film forming conditions 5.

Figure 5:
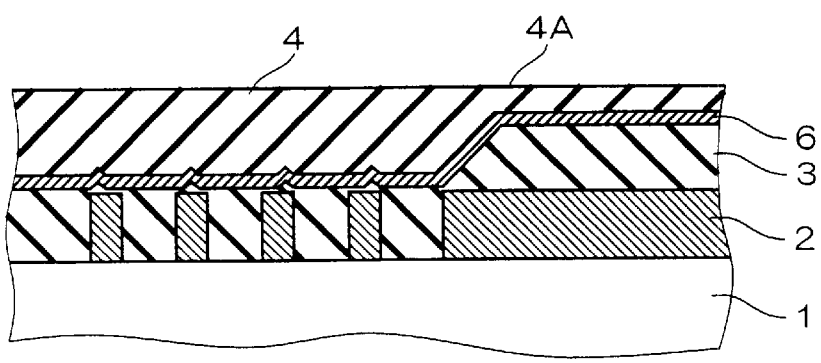
Figure 6:
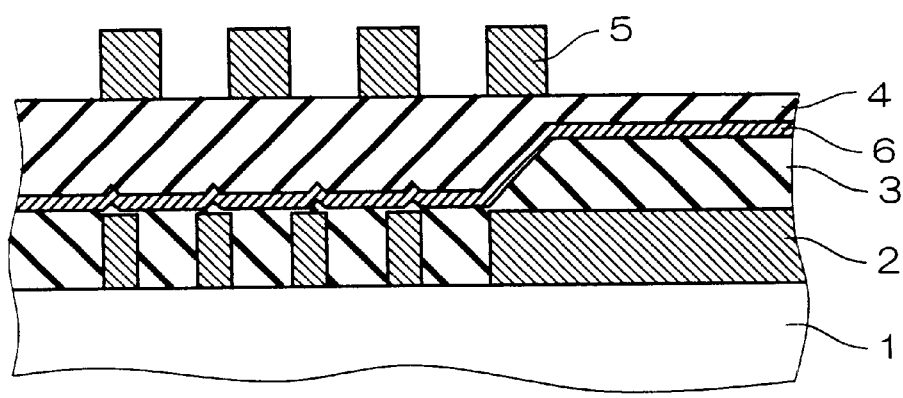

The irregular surface of the spacer film 4 is polished by CMP for forming a flat surface 4A (FIG. 5). A metal film is formed on the flat surface 4A similarly to that for the first layer metal wires 2, for forming the second layer metal wires 5 through photolithography (FIG. 6).

When employing the method of manufacturing a semiconductor device according to this embodiment, the semiconductor device D1 according to the embodiment 1 can be manufactured. The surface of the SiOF film 3 is not polished, so that the SiOF film 3 will not remarkably absorb moisture during the steps. When employing a silicon oxide film as the F diffusion prevention film 6, the numerical ratio of the gas flow rates of oxygen and silane is so set that oxygen/silane≦1.6, whereby a number of Si—H bonds can be mixed into the silicon oxide film.

Embodiment 3.

FIG. 11 typically illustrates the structure of a semiconductor device D2 according to an embodiment 3 of the present invention. The semiconductor device D2 comprises a second F diffusion prevention film 7 between a spacer film 4 and second layer metal wires 5, in addition to a structure similar to that of the semiconductor device D1 according to the embodiment 1. The second F diffusion prevention film 7 may be formed by a silicon oxynitride film, a silicon oxide film containing Si—H bonds, or a silicon oxide film injected with nitrogen atoms, for example, similarly to a first F diffusion prevention film 6.

Since the second layer metal wires 5 are formed on its surface, the second F diffusion prevention film 7 may be etched along with the second layer metal wires 5, as described above. Due to the presence of the first F diffusion prevention film 6, however, prevention of F diffusion and prevention of moisture absorption of an SiOF film 3 are implemented even if the second F diffusion prevention film 7 is etched. If the second F diffusion prevention film 7 is not etched, on the other hand, the aforementioned effects can be more reliably attained.

When employing the semiconductor device D2 according to this embodiment, the effects of the semiconductor device D1 according to the embodiment 1 can be attained while, if there is a small possibility that the second F diffusion prevention film 7 is etched along with the second layer metal wires 5, diffusion of F atoms and moisture absorption of the SiOF film 3 are more reliably prevented.

Embodiment 4.

Figure 14:
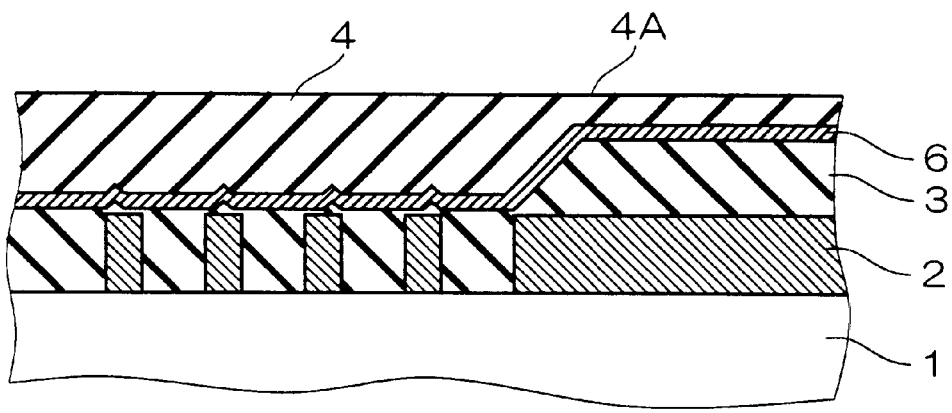

FIGS. 12 to 15 show steps in a method of manufacturing the semiconductor device D2. The steps shown in FIGS. 12 to 14 are absolutely identical to those shown in FIGS. 3 to 5 in the embodiment 2 respectively, and film formation and film forming conditions may be similar to those in the embodiment 2.

A second F diffusion prevention film 7 is formed on a flat surface 4A similarly to a first F diffusion prevention film 6. When a silicon oxynitride film is employed as the second F diffusion prevention film 7, for example, the film is formed by plasma CVD under the film forming conditions 2, for example, or formed by HDPCVD under the film forming conditions 3, for example. When employing a silicon oxide film containing Si—H bonds, the film is formed by HDPCVD under the film forming conditions 4, for example. When employing a silicon oxide film injected with nitrogen atoms, the silicon oxide film is formed by HDPCVD under the film forming conditions 5, for example, and nitrogen atoms may be injected under the film forming conditions 6, for example.

Figure 15:
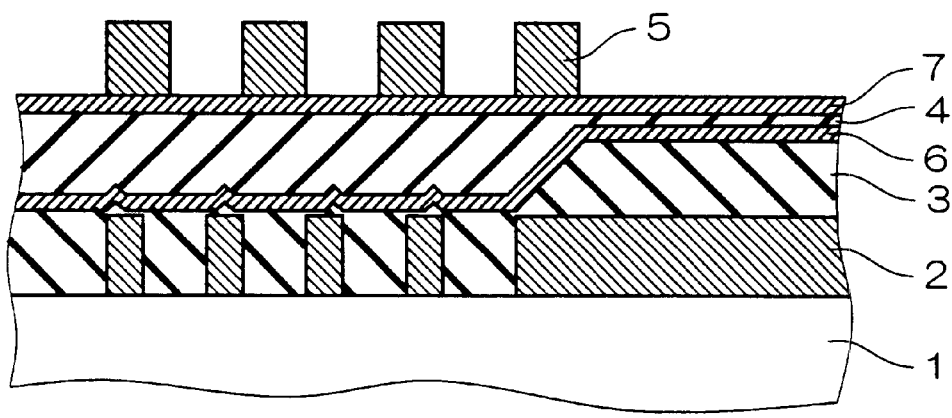
Figure 16:
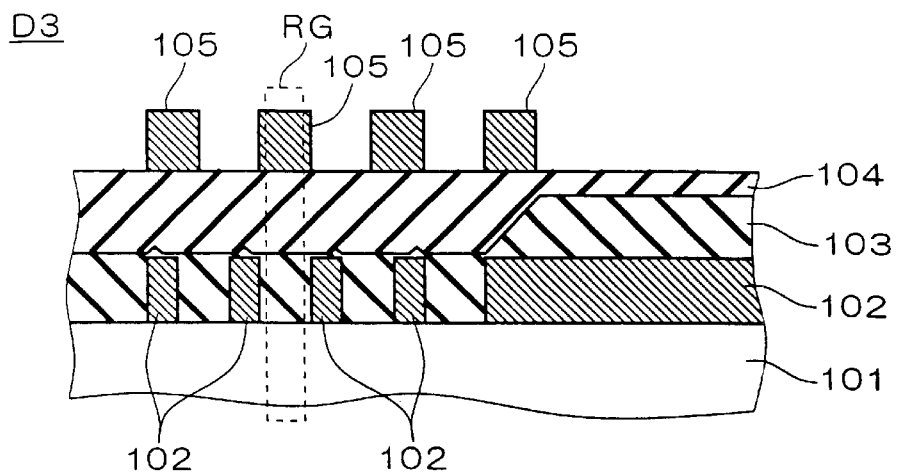
FIG. 16 illustrates a conventional semiconductor device.
Figure 17:
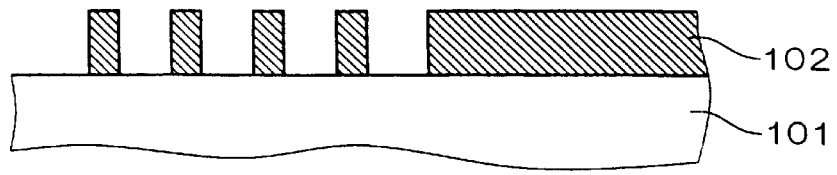
FIGS. 17 to 20 illustrate steps in a method of manufacturing the conventional semiconductor device.
Figure 18:
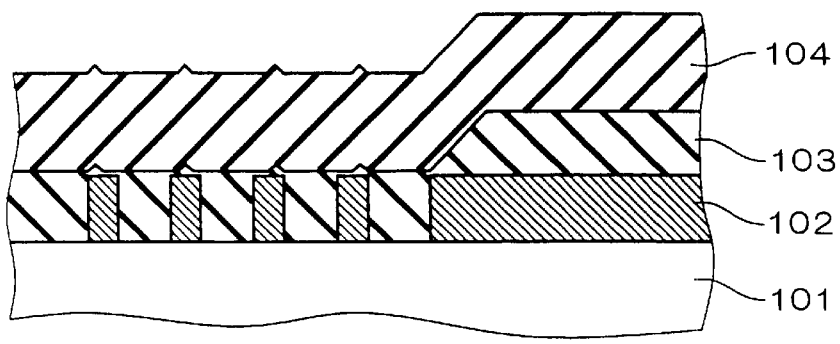
Figure 19:
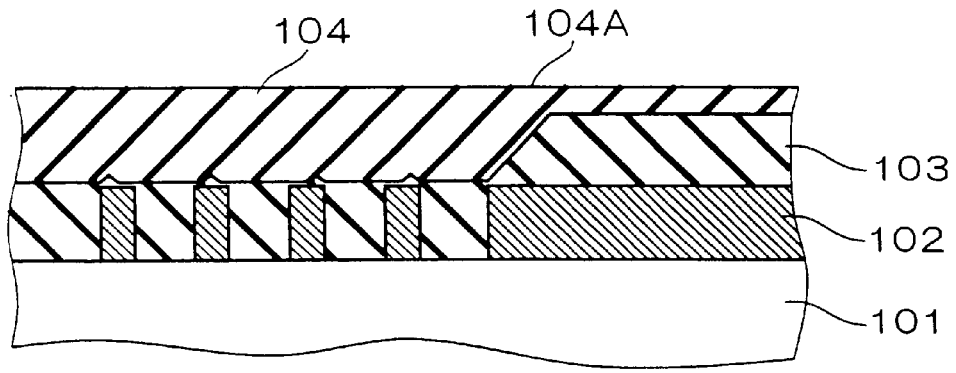
Figure 20:
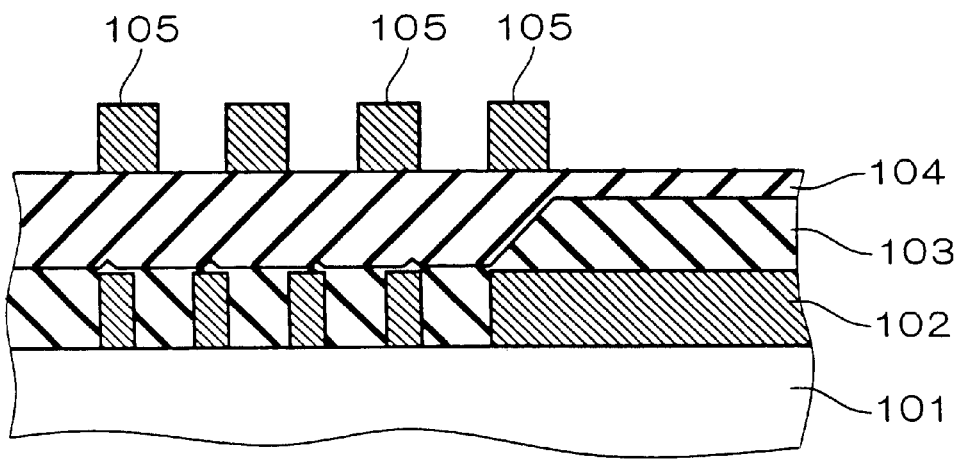
Figure 21A:
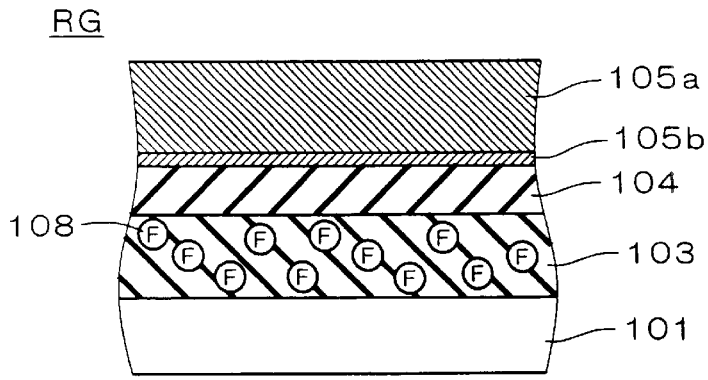
FIGS. 21A to 21C illustrate a problem in the conventional semiconductor device.
Figure 21B:
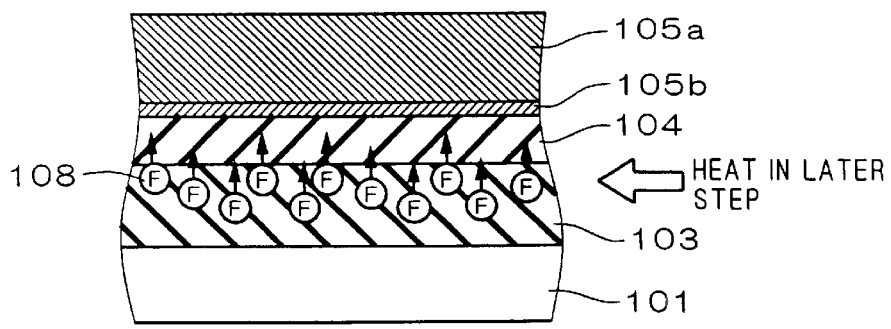
Figure 21C:
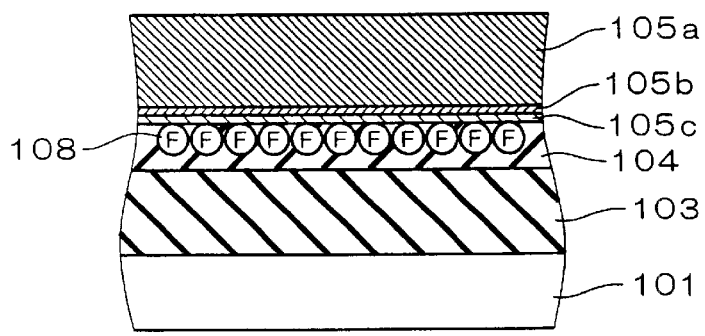

A metal film is formed similarly to that for first layer metal wires 2, for forming second layer metal wires 5 through photolithography (FIG. 15).

When employing the method of manufacturing a semiconductor device according to this embodiment, the semiconductor device D2 according to the embodiment 3 can be manufactured. Further, the effects of the method of manufacturing a semiconductor device according to the embodiment 2 can be attained.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising
   a) preparing a base layer having a surface;
   b) forming a first interlayer isolation film having a surface and consisting of a silicon oxide film containing fluorine on said surface of said base layer;
   c) forming a second interlayer isolation film having a surface and containing bonds of silicon atoms and nitrogen atoms, bonds of silicon and hydrogen atoms, or nitrogen atoms on said surface of said first interlayer isolation film;
   d) forming a third interlayer isolation film having a surface on said surface of said second interlayer isolation film; and
   e) polishing and flattening said surface of said third interlayer isolation film by chemical mechanical polishing,
   wherein the surface of the first interlayer film is not polished and flattened.

2. The method of claim 1, wherein said second interlayer isolation film is a silicon oxynitride film.

3. The method of claim 1, wherein said second interlayer isolation film is a silicon oxide film containing bonds of silicon atoms and hydrogen atoms.

4. The method of claim 3, wherein c) comprises forming said second interlayer isolation film by high density plasma CVD employing silane and oxygen as source gases under a condition of a gas flow ratio of (oxygen gas flow rate/silane gas flow rate)≦1.6.

5. The method of claim 1, wherein said second interlayer isolation film is a silicon oxide film injected with nitrogen atoms.

6. The method of claim 1, further comprising f) forming a fourth interlayer isolation film containing bonds of silicon atoms and nitrogen atoms, bonds of silicon atoms and hydrogen atoms, or nitrogen atoms on said surface of said third interlayer isolation film subsequent to e).

7. The method of claim 6, wherein said fourth interlayer isolation film is a silicon oxynitride film.

8. The method of claim 6, wherein said fourth interlayer isolation film is a silicon oxide film containing bonds of silicon atoms and hydrogen atoms.

9. The method of claim 8, wherein f) comprises forming said fourth interlayer isolation film by high density plasma CVD employing silane and oxygen as source gases under a condition of a gas flow ratio of (oxygen gas flow rate/silane gas flow rate)≦1.6.

10. The method of claim 6, wherein said fourth interlayer isolation film is a silicon oxide film injected with nitrogen atoms.

11. The method of claim 1, wherein said third interlayer isolation film is a silicon oxide film.

* * * * *